United States Patent
Park et al.

(10) Patent No.: US 9,514,857 B2
(45) Date of Patent: Dec. 6, 2016

(54) ZINC OXIDE PRECURSOR AND METHOD OF DEPOSITING ZINC OXIDE-BASED THIN FILM USING THE SAME

(71) Applicant: Samsung Corning Precision Materials Co., Ltd., Gyeongsangbuk-do (KR)

(72) Inventors: SooHo Park, ChungCheongNam-Do (KR); JongSe Park, ChungCheongNam-Do (KR); Young Zo Yoo, ChungCheongNam-Do (KR); Joo Young Lee, ChungCheongNam-Do (KR); Seo Hyun Kim, ChungCheongNam-Do (KR); Gun Sang Yoon, ChungCheongNam-Do (KR); Myong Woon Kim, ChungCheongNam-Do (KR); Hyung Soo Shin, ChungCheongNam-Do (KR); Seung Ho Yoo, ChungCheongNam-Do (KR); Sang Do Lee, ChungCheongNam-Do (KR); Sang Ick Lee, ChungCheongNam-Do (KR); Sang Jun Yim, ChungCheongNam-Do (KR)

(73) Assignee: Corning Precision Materials Co., Ltd. (KR)

( * ) Notice: Subject to any disclaimer, the term of this patent is extended or adjusted under 35 U.S.C. 154(b) by 450 days.

(21) Appl. No.: 14/049,352

(22) Filed: Oct. 9, 2013

(65) Prior Publication Data
US 2014/0099443 A1    Apr. 10, 2014

(30) Foreign Application Priority Data
Oct. 9, 2012  (KR) .................... 10-2012-0111674

(51) Int. Cl.
*H01B 1/08*    (2006.01)
*C03C 17/245*    (2006.01)
(Continued)

(52) U.S. Cl.
CPC .............. *H01B 1/08* (2013.01); *C03C 17/245* (2013.01); *C23C 16/407* (2013.01);
(Continued)

(58) Field of Classification Search
None
See application file for complete search history.

(56) References Cited

U.S. PATENT DOCUMENTS

| | | | |
|---|---|---|---|
| 4,751,149 A * | 6/1988 | Vijayakumar | ........ C23C 16/407 |
| | | | 136/256 |
| 8,163,342 B2 | 4/2012 | Stricker et al. | |

(Continued)

FOREIGN PATENT DOCUMENTS

| CN | 1873051 A | 12/2006 |
|---|---|---|
| KR | 20120060843 A | 6/2012 |
| WO | 2011020028 A2 | 2/2011 |

OTHER PUBLICATIONS

Saba Javed et al: "Synthesis of zinc trisubstituted hydrazido complexes and ortho-metalation of 4-(dimethylamino)pyridine", Dalton Transactions, vol. 39,No. 47, Oct. 26, 2010, p. 11439, XP055094597, ISSN: 1477-9226, DOI:10.1039/c0dt00847h.

(Continued)

*Primary Examiner* — Mandy Louie
(74) *Attorney, Agent, or Firm* — Lerner, David, Littenberg, Krumholz & Mentlik, LLP

(57) ABSTRACT

A zinc oxide (ZnO) precursor and a method of depositing a ZnO-based thin film using the same, with which a high-quality and high-purity ZnO-based thin film can be deposited. The ZnO precursor includes a mixture solvent containing at least two organic solvents which are mixed and a source material comprising diethyl zinc or dimethyl zinc which is diluted in the mixture solvent.

13 Claims, 9 Drawing Sheets

(51) Int. Cl.
*C23C 16/40* (2006.01)
*C23C 16/448* (2006.01)
*H01L 21/02* (2006.01)
*H01L 31/18* (2006.01)
*H01L 31/0224* (2006.01)

(52) U.S. Cl.
CPC ........ *C23C 16/448* (2013.01); *H01L 21/0262* (2013.01); *H01L 21/02554* (2013.01); *H01L 31/022483* (2013.01); *H01L 31/1884* (2013.01); *C03C 2217/216* (2013.01); *Y02E 10/50* (2013.01)

(56) References Cited

U.S. PATENT DOCUMENTS

| 2002/0075126 | A1* | 6/2002 | Reitz | B82Y 30/00 338/21 |
| 2006/0275948 | A1* | 12/2006 | Takamatsu | C23C 16/407 438/104 |
| 2012/0094019 | A1* | 4/2012 | Inaba | C01G 9/02 427/162 |
| 2013/0022745 | A1 | 1/2013 | Dussarrat et al. | |

OTHER PUBLICATIONS

Kanjolia R et al: "Dimethylzinc adduct chemistry revisited: MOCVD of vertically aligned ZnO nanowires using the dimethylzinc 1, 4-dioxane adduct", Journal of Crystal Grouth, vol. 315, No. 1, Oct. 17, 2010, pp. 292-296, XP028137776,ISSN: 0022-0248, DOI: 1001016/J.JCRYSGRO.2010.09.016 [retrived on Sep. 17, 2010].

Sattarzadeh E et al: "Size-controlled synthesis of ZnO nanocrystals from diethylzinc and donor-functionalized alchohols", Materials Lettets, North Holland Publishing Company. Amsterdam, NL, vol. 65, No. 3, Feb. 15, 2011, pp. 527-529, XP027574436, ISSN: 0127-577X [retrived on Dec. 24, 2010].

\* cited by examiner

ZINC OXIDE PRECURSOR AND METHOD OF DEPOSITING ZINC OXIDE-BASED THIN FILM USING THE SAME

CROSS REFERENCE TO RELATED APPLICATION

The present application claims priority from Korean Patent Application Number 10-2012-0111674 filed on Oct. 9, 2012, the entire contents of which are incorporated herein for all purposes by this reference.

BACKGROUND OF THE INVENTION

1. Field of the Invention

The present invention relates to a zinc oxide (ZnO) precursor and a method of depositing a ZnO-based thin film using the same, and more particularly, to a ZnO precursor and a method of depositing a ZnO-based thin film using the same, with which a high-quality and high-purity ZnO-based thin film can be deposited.

2. Description of Related Art

Flat panel displays, such as a thin-film transistor liquid crystal display (TFT-LCD), a plasma display panel (PDP), a field emission display (FED), and an organic light-emitting device (OLED), photovoltaic cells using photoelectric effect, touch screens, or the like require a transparent conductive electrode, i.e. a conductive material which transmits light.

A transparent conductive film is one of key materials that are essential for flat panel displays, photovoltaic cells, or the like. The transparent conductive film serves to protect internal electronic devices from external influences, transfer signals and current to electronic devices, and transmit light emitted from the electronic devices to a screen without resistance. The transparent conductive film is required to have superior transmission and electrical conductivity. A material used for such a transparent conductive film must have a low resistivity ($10^{-3}$ to $10^{-4}$ $\Omega$cm) and a high light transmittance in the visible light range. In addition, the characteristics of the material that is used for the transparent conductive film are required to change little due to heat during the fabrication process of the internal electronic devices.

An example of the transparent electrode material that has been most popular to dates is indium tin oxide (ITO: $In_{1-x}Sn_xO_3$). Although ITO has superior optical properties, it has the following drawbacks: The fabrication price of In, one of its source elements, is very high, and the properties of ITO are significantly changed by heat when it is exposed to plasma.

In contrast, referring to zinc oxide (ZnO) having a band gap of about 3.4 eV, its infrared (IR) and visible light transmittances are very good, and it has superior electrical conductivity and superior endurance to plasma. In addition, ZnO can be grown at a low temperature, and its fabrication price is relatively low. Therefore, ZnO is emerging as a promising material for a transparent electrode of a large display and a functional window.

ZnO can be deposited on a substrate to form a thin film by physical vapor deposition (PVD). When sputtering is selected from among PVD methods, a ZnO-based target is used for a target material. For a precursor for the fabrication of ZnO, a Zn complex to which an organic ligand is bonded is mainly used. Among well-known complexes, $Zn(O_2CMe)_2$, $Zn_4O(O_2CNEt2)_6$ and the like are volatized at a relatively low temperature. However, they cause carbon contamination in the thin film, which is problematic. In addition, while a metal halide compound is widely used as a precursor for the production of ZnO, its low volatility requires a high temperature, which makes processing difficult. In addition, studies on the process of depositing a ZnO-based thin film on a substrate by chemical vapor deposition (CVD) using a source material, such as diethyl zinc (DEZ) or a DEZ octane solution, have also been carried out.

FIG. 1 is a configuration view schematically showing a plasma-enhanced chemical vapor deposition (PECVD) apparatus which deposits a ZnO-based thin film using as a related-art source material of DEZ or dimethyl zinc (DMZ). FIG. 1 illustrates a PECVD apparatus which deposits undoped ZnO and F- and B-doped ZnO. The PECVD apparatus shown in FIG. 1 forms a reaction composition by combining DEZ or DMZ as a fugitive organic metal zinc compound, Ar or He as a carrier gas, $CO_2$ as an oxidizer, and tetraethyl boron (TEB) or nitrogen trifluoride ($NF_3$) as a dopant, and blows the reaction composition into a deposition chamber 1, thereby depositing a ZnO-based thin film on a substrate 5. Among reference numerals which have not been described, 2 indicates an upper electrode, 3 indicates a lower electrode, 4 indicates a hole, 6 indicates an opening, 7 indicates a power source, 8, 9, 10, 11, 12 and 13 indicate lines, 14, 15, 16, 17, 18 and 19 indicate mass flow controllers (MFCs), and 20 indicates a thermostat.

FIG. 2 is a cross-sectional view schematically showing a deposition chamber which deposits a ZnO-based thin film using a related-art source material, i.e. a solution produced by dissolving DEZ into an organic solvent. A solution that was produced by dissolving DEZ into an organic solvent, such as ether, ketone, ester, hydrocarbon or alcohol, is vaporized. The vaporized solution is supplied into a deposition chamber via a duct 24, and at the same time, an oxidizer gas, such as oxygen gas, ozone gas, nitrogen oxide gas or water vapor, is supplied into the deposition chamber via a duct 25. Among reference numerals which have not been described, 21 indicates a substrate, 22 indicates a susceptor, 23 indicates a heater, 26 indicates a rotary shaft, 27 indicates a reactant gas outlet, and 29 indicates a reaction chamber.

However, when DEZ or DMZ is used as in FIG. 1, there are problems in that the vapor pressure is too high, that the danger of ignition is significant owing to high reactivity, and that it is not easy to control the composition of the thin film. In particular, there are disadvantages in that the deposition of the ZnO-based thin film using a precursor, such as DEZ or DMZ, must be carried out under low pressure, and that atmospheric pressure chemical vapor deposition (APCVD) cannot be used. Therefore, as shown in FIG. 2, the method of suppressing the natural volatility and explosiveness and forming a high-purity ZnO thin film by dissolving DEZ or DMZ into an organic solution has also been studied. However, since the precursor and the diluted solvent have different vapor pressures, this method requires chemical deposition to be performed by vaporizing the source material after supplying the source material into a vaporizer, which is problematic. In addition, when the source material is imperfectly vaporized, there is high possibility that impurities may be deposited inside the vaporizer due to imperfect decomposition of the source material, thereby clogging the vaporizer or causing the reproducibility of a thin film to be significantly inferior.

The information disclosed in the Background of the Invention section is provided only for better understanding of the background of the invention, and should not be taken as an acknowledgment or any form of suggestion that this information forms a prior art that would already be known to a person skilled in the art.

BRIEF SUMMARY OF THE INVENTION

Various aspects of the present invention provide a zinc oxide (ZnO) precursor and a method of depositing a ZnO-based thin film using the same, with which a high-quality and high-purity ZnO-based thin film can be deposited.

In an aspect of the present invention, provided is a ZnO precursor that includes: a mixture solvent containing at least two organic solvents which are mixed; and a zinc oxide precursor source material which is diluted in the mixture solvent. The zinc oxide precursor source material includes diethyl zinc or dimethyl zinc.

According to an exemplary embodiment of the present invention, each of the organic solvents may be paraffin-based hydrocarbon expressed by the formula $C_nH_{2n+2}$ or cyclo-paraffin-based hydrocarbon expressed by the formula $C_nH_{2n}$, where n is a number in the range from 5 to 12.

The mixture solvent may include octane and heptane.
The mixture solvent may include octane and hexane.
The mixture solvent may include octane and pentane.
The content of the source material may range from 0.1 to 2 mol/L.

In addition, the vapor pressure of the source material may range from 95 to 99% of the vapor pressure of the mixture solvent.

In an aspect of the present invention, provided is a method of depositing a ZnO-based thin film on a substrate by chemical vapor deposition (CVD). The method deposits the ZnO-based thin film using a ZnO precursor and an oxidizer. The ZnO precursor comprises a mixture solvent comprising at least two organic solvents which are mixed and a source material comprising diethyl zinc or dimethyl zinc which is diluted in the mixture solvent.

According to an exemplary embodiment of the present invention, the organic solvents may be paraffin-based hydrocarbon expressed by the formula $C_nH_{2n+2}$ or cyclo-paraffin-based hydrocarbon expressed by the formula $C_nH_{2n}$, where n is a number in the range from 5 to 12.

The mixture solvent may include octane and heptane.
The mixture solvent may include octane and hexane.
The mixture solvent may include octane and pentane.
The CVD may control the vapor pressure of the source material to be in the range from 95 to 99% of the vapor pressure of the mixture solvent.

The CVD may be implemented as atmospheric pressure chemical vapor deposition (APCVD).

The CVD may include vaporizing the ZnO precursor and supplying a vaporized gas of the ZnO precursor into a deposition chamber in which the substrate is placed. Here, the zinc oxide precursor can be vaporized by blowing a gas into the zinc oxide precursor without using a vaporizer.

The ZnO precursor may be transported on a carrier gas into the deposition chamber, the carrier gas being implemented as an inert gas.

The oxidizer may be implemented as at least one selected from the group consisting of oxygen gas, ozone gas, nitrogen oxide gas, water vapor and alcohol vapor.

The CVD may dope the ZnO-based thin film with a dopant.

In addition, the substrate may be implemented as one selected from the group consisting of a Si substrate, a sapphire substrate, a ceramic substrate, a glass substrate, a metal oxide substrate and a metal substrate.

According to embodiments of the invention, a mixture solvent is made by mixing at least two organic solvents at a predetermined ratio, and a source material of DEZ or DMZ is diluted in the mixture solvent. This consequently makes it possible to set the vapor pressures of the source material and the mixture solvent to be substantially identical with each other, thereby suppressing the volatility and explosiveness of the source material. It is therefore possible to uniformly mix the source material and the mixture solvent without using a related-art vaporizer, thereby depositing a high-quality and high-purity ZnO-based thin film on a substrate by APCVD.

In addition, since the ZnO-based thin film is deposited by APCVD that is suitable for mass production due to rapid deposition speed and high productivity, a mass production process for ZnO-based thin films is possible.

The methods and apparatuses of the present invention have other features and advantages which will be apparent from, or are set forth in greater detail in the accompanying drawings, which are incorporated herein, and in the following Detailed Description of the Invention, which together serve to explain certain principles of the present invention.

DETAILED DESCRIPTION OF THE INVENTION

Figure 1:
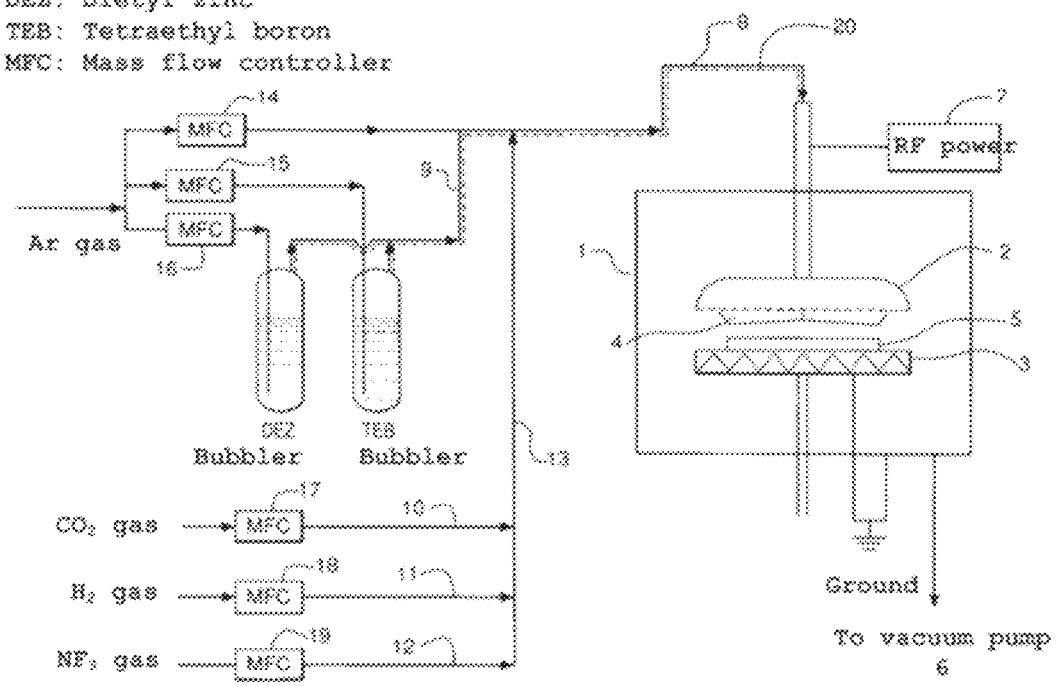
FIG. 1 is a configuration view schematically showing a plasma-enhanced chemical vapor deposition (PECVD) apparatus which deposits a zinc oxide (ZnO)-based thin film using a related-art source material of diethyl zinc (DEZ) or dimethyl zinc (DMZ)
Figure 2:
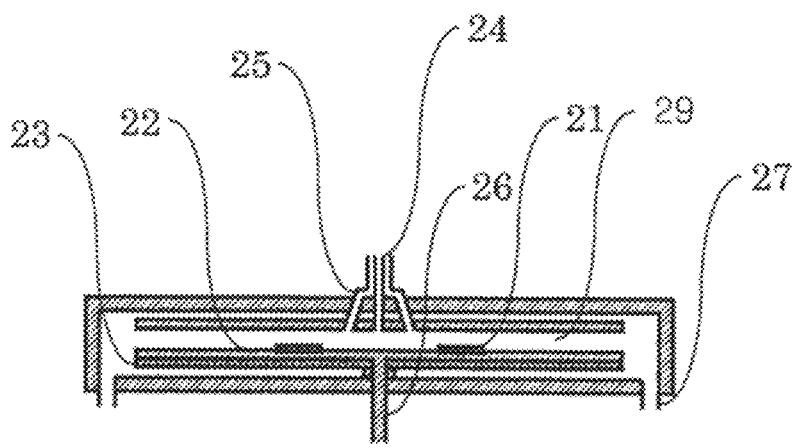
FIG. 2 is a cross-sectional view schematically showing a deposition chamber which deposits a ZnO-based thin film using a related-art source material, i.e. a solution produced by dissolving DEZ into an organic solvent.

Reference will now be made in detail to a zinc oxide (ZnO) precursor and a method of depositing a ZnO-based thin film using the same according to the present invention, embodiments of which are illustrated in the accompanying drawings and described below, so that a person having ordinary skill in the art to which the present invention relates can easily put the present invention into practice.

Throughout this document, reference should be made to the drawings, in which the same reference numerals and signs are used throughout the different drawings to designate the same or similar components. In the following description of the present invention, detailed descriptions of known functions and components incorporated herein will be omitted when they may make the subject matter of the present invention unclear.

The ZnO precursor according to an embodiment of the present invention is a Zn source that is used together with an oxidizer to deposit a ZnO-based thin film in a chemical vapor deposition (CVD) process.

A mixture solvent is a mixture of at least two organic solvents. Such an organic solvent can be paraffin-based hydrocarbon expressed by the formula $C_nH_{2n+2}$ or cyclo-paraffin-based hydrocarbon expressed by the formula $C_nH_{2n}$. For instance, the mixture solvent can include octane and heptane. Here, n is a number in the range from 5 to 12. In addition, the mixture solvent can include octane and hexane or octane and pentane.

In addition, a source material is implemented as diethyl zinc (DEZ) or dimethyl zinc (DMZ). The source material is diluted in the mixture solvent, in which the content of the source material diluted in the mixture solvent can range from 0.1 to 2 mol/L. In addition, the vapor pressure of the source material can range from 95 to 99% of the vapor pressure of the mixture solvent.

Figure 3:
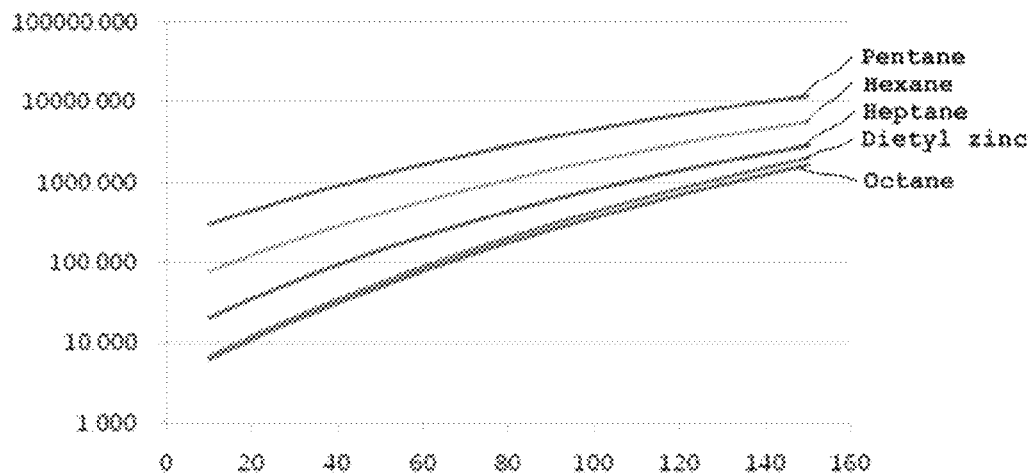
FIG. 3 is a graph showing the vapor pressures of DEZ, octane, heptane, hexane and pentane.

The ZnO precursor according to an embodiment of the present invention includes the source material implemented as DEZ or DMZ which is difficult to treat because of its chemical characteristic of being explosive in oxygen and the mixture solvent of at least two organic solvents into which the source material is diluted. Therefore, it is possible to suppress the volatility and explosiveness of the source material, i.e. realize safety. Accordingly, it is possible to carry out CVD at atmospheric pressure and deposit a high-quality and high-purity ZnO-based thin film. In addition, as shown in FIG. 3, in order to make the vapor pressures of the source material and the solvent be substantially identical, the ZnO precursor according to an embodiment of the present invention is configured such that the source material is diluted in the mixture solvent which is not a single solvent and contains therein at least two solvents which are mixed at a predetermined ratio. Accordingly, it is possible to uniformly volatize the source material and the mixture solvent without using a vaporizer which has been used during CVD since the vapor pressure of a related-art source material differs from that of a solvent.

Reference will now be made to a method of depositing a ZnO-based thin film according to an embodiment of the present invention.

The method of depositing a ZnO-based thin film according to an embodiment of the present invention deposits a ZnO-based thin film on a substrate by chemical vapor deposition (CVD), in particular, atmospheric pressure chemical vapor deposition (APCVD).

Figure 4:
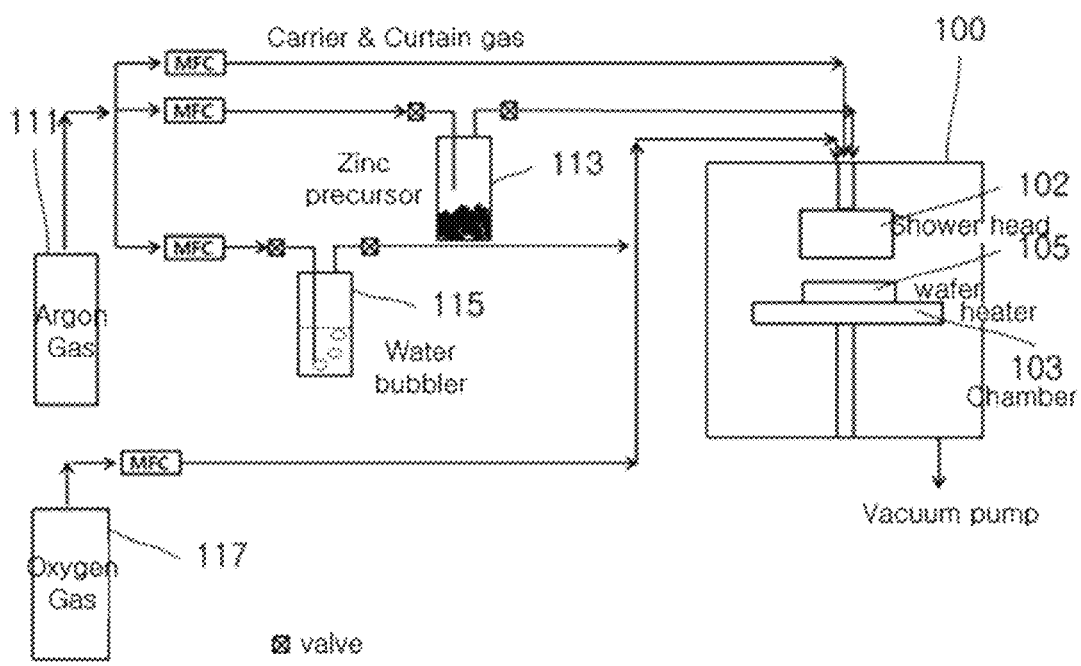
FIG. 4 is a configuration view schematically showing a chemical vapor deposition (CVD) apparatus used in a method of depositing a zinc oxide (ZnO)-based thin film according to an embodiment of the present invention.

Specifically, the method of depositing a ZnO-based thin film according to an embodiment of the present invention can use an APCVD apparatus, as shown in FIG. 4. The method of depositing a ZnO-based thin film according to an embodiment of the present invention includes, first, loading a substrate 105 into a deposition chamber 100 which has an upper electrode 102 and a lower electrode 103. The upper electrode 102 has the shape of a shower head, which refers to a chamber, a plenum or other structures having a plurality of holes through which a precursor or the like is ejected into the deposition chamber 100.

According to an embodiment of the present invention, the substrate 105 can be implemented as one selected from among a Si substrate, a sapphire substrate, a ceramic substrate, a glass substrate, a metal oxide substrate and a metal substrate. In order to increase the deposition efficiency of the ZnO-based thin film and realize the deposition reproducibility of the ZnO-based thin film, the substrate 105 can be heated to a temperature ranging from 100 to 400° C., preferably, from 250 to 350° C.

Afterwards, a ZnO precursor and an oxidizer that are to be deposited to form a ZnO-based thin film are supplied into the deposition chamber 100. The ZnO precursor can be implemented as one that includes a mixture solvent of at least two organic solvents and a source material diluted in the mixture solvent, the source material being implemented as diethyl zinc (DEZ) or dimethyl zinc (DMZ). The mixture solvent can be used herein by selecting at least two organic solvents, for example, from among paraffin-based hydrocarbons expressed by the formula $C_nH_{2n+2}$ or cyclo-paraffin-based hydrocarbons expressed by the formula $C_nH_{2n}$. For example, octane and heptane, octane and hexane, or octane and pentane can be used. In addition, the source material can be added at a content ranging from 0.1 to 2 mol/L to the mixture solvent. This is intended to set the vapor pressure of the source material to a value ranging from 95 to 99% of the vapor pressure of the mixture solvent.

Figure 5:
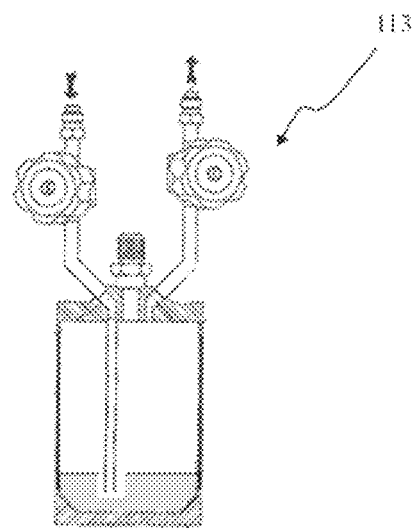
FIG. 5 and FIG. 6 are cross-sectional views showing the canister of the CVD apparatus shown in FIG. 4.
Figure 6:
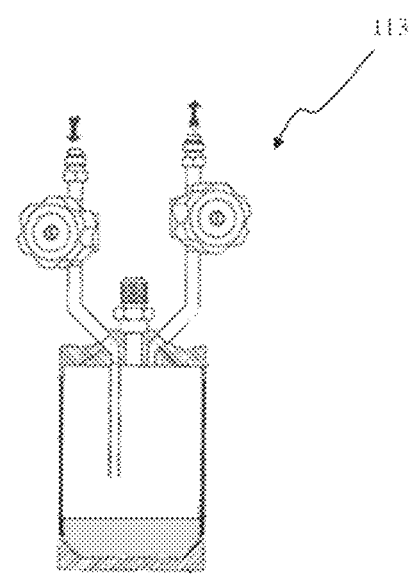

The ZnO precursor is supplied in the vaporized state, i.e. gas state, into the deposition chamber 100. Therefore, in the state in which the ZnO precursor is contained in a ZnO precursor supplying part 113, a carrier gas implemented as an inert gas, such as $N_2$, He or Ar, is supplied from a carrier gas supplying part 111 to the ZnO precursor supplying part 113. In this way, the ZnO precursor gas that is produced by vaporizing the ZnO precursor or generating only vapor is transported on the carrier gas into the deposition chamber 100. The ZnO precursor supplying part 113 can be provided in the shape of a dip tube, as shown in FIG. 5, or in the shape of a canister, as shown in FIG. 6.

In this way, the oxidizer gas from oxidizer supplying parts 115 to 117 is supplied to the deposition chamber 100 together with the ZnO precursor gas that is transported on the carrier gas into the deposition chamber 100. Here, the oxidizer can be implemented as one selected from among oxygen gas, ozone gas, nitrogen oxide gas, water vapor and alcohol vapor.

As shown in FIG. 4, it is preferable to control the ZnO precursor and the oxidizer to be fed along different paths in order to prevent the ZnO precursor and the oxidizer from mixing before entering the deposition chamber. The flow rate of each of the gases contained in the carrier gas supplying part, the ZnO precursor supplying part 113 and the oxidizer supplying parts 115 and 117 can be adjusted by manipulating a mass flow controller (MFC) which is disposed in each part.

In addition, when the ZnO-based thin film that is deposited according to an embodiment of the present invention is applied, for example, for a transparent electrode of a photovoltaic cell, electrical conductivity is required. Therefore, according to an embodiment of the present invention, it is possible to inject a variety of dopants into the ZnO-based thin film that is deposited. Here, the dopant injected into the ZnO-based thin film can be one or two selected from among Ga, B, F and Al. The dopant acts to take the place of Zn or O in the internal lattice of ZnO, thereby improving electrical characteristics of ZnO. Here, the doping process can be performed by inputting the dopant into the deposition chamber 100 during CVD or by, for example, ion implantation after depositing a ZnO-based thin film on the substrate 105 by CVD. This can consequently impart conductivity to the ZnO-based thin film that is deposited, which is then applicable for a transparent electrode of a display or a photovoltaic cell.

Since the ZnO precursor that is produced by making the mixture solvent by mixing at least two organic solvents at a predetermined ratio and diluting the source material of DEZ or DMZ in the mixture solvent as described above is used in atmospheric pressure chemical vapor deposition (APCVD), it is possible to set the vapor pressure of the source material to a value ranging from 95 to 99% of the vapor pressure of the mixture solvent and thus set the vapor pressures of the source material and the mixture solvent to be substantially identical with each other, thereby suppressing the volatility and explosiveness of the source material. It is therefore possible to uniformly mix the source material and the mixture solvent without using a related-art vaporizer. This makes it possible to employ APCVD, thereby depositing a high-quality and high-purity ZnO-based thin film on the substrate 105. Since the high-quality and high-purity ZnO-based thin film is deposited by APCVD, a mass production process for ZnO-based thin films is possible.

Example 1

1. Preparation of Source Material (ZnO Precursor)

Ar atmosphere was created inside a canister that has an inner diameter of 70 cm and a height of 50 cm by supplying inert Ar gas into the canister. An octane and heptane mixture solution, octane and hexane mixture solution or an octane and pentane mixture solution in which DEZ was previously diluted was inputted into the canister. The mixture solution was then stirred at room temperature and under atmospheric pressure, thereby producing a source material. The content of DEZ contained in the source material was set to 0.3 mol/L. In addition, the total vapor pressure was calculated based on Raoult's law and Dalton's law. Afterwards, as presented in Table 1 to Table 3, the vapor pressure of octane and heptane depending on the temperature, the vapor pressure of octane and hexane depending on the temperature and the vapor pressure of octane and pentane depending on the temperature were set identical with the vapor pressures of DEZ.

TABLE 1

| | 0.3M DEZ solution | | | |
|---|---|---|---|---|
| | Octane dosage (mol/l) | Heptane dosage (mol/l) | Vapor pressure of octane-heptane mixture solution | Vapor pressure of DEZ |
| 24° C. | 5.622 | 0.381 | 15.09 torr | 15.10 torr |
| 40° C. | 5.633 | 0.368 | 34.83 torr | 34.83 torr |
| 80° C. | 5.383 | 0.646 | 202.05 torr | 202.07 torr |

TABLE 2

| | 0.3M DEZ solution | | | |
|---|---|---|---|---|
| | Octane dosage (mol/l) | Hexane dosage (mol/l) | Vapor pressure of octane-hexane mixture solution | Vapor pressure of DEZ |
| 24° C. | 5.894 | 0.087 | 15.10 torr | 15.10 torr |
| 40° C. | 5.900 | 0.080 | 34.83 torr | 34.83 torr |
| 80° C. | 5.825 | 0.173 | 202.07 torr | 202.07 torr |

TABLE 3

| | 0.3M DEZ solution | | | |
|---|---|---|---|---|
| | Octane dosage (mol/l) | Pentane dosage (mol/l) | Vapor pressure of octane-Pentane mixture solution | Vapor pressure of DEZ |
| 24° C. | 5.949 | 0.023 | 15.10 torr | 15.10 torr |
| 40° C. | 5.949 | 0.023 | 34.83 torr | 34.83 torr |
| 80° C. | 5.924 | 0.058 | 202.07 torr | 202.07 torr |

2. Deposition of ZnO-Based Thin Film

A glass substrate was set to a heating part that is disposed in a deposition chamber of a CVD apparatus, the degree of vacuum inside the deposition chamber was set to atmospheric pressure, the temperature inside the canister was set to room temperature, and the temperature of the glass substrate was maintained at 350° C. In sequence, a ZnO-based thin film was deposited on the glass substrate for several minutes by supplying a carrier gas at a flow rate of 20 sccm/min to the source material using a gas flow rate controller in order to facilitate vaporization of the source material, supplying Ar gas to the source material at a flow rate of 50 sccm/min through a carrier gas supply line which was heated to 80° C., and supplying Oxygen gas to the source material at a flow rate of 5 sccm/min.

Figure 7:
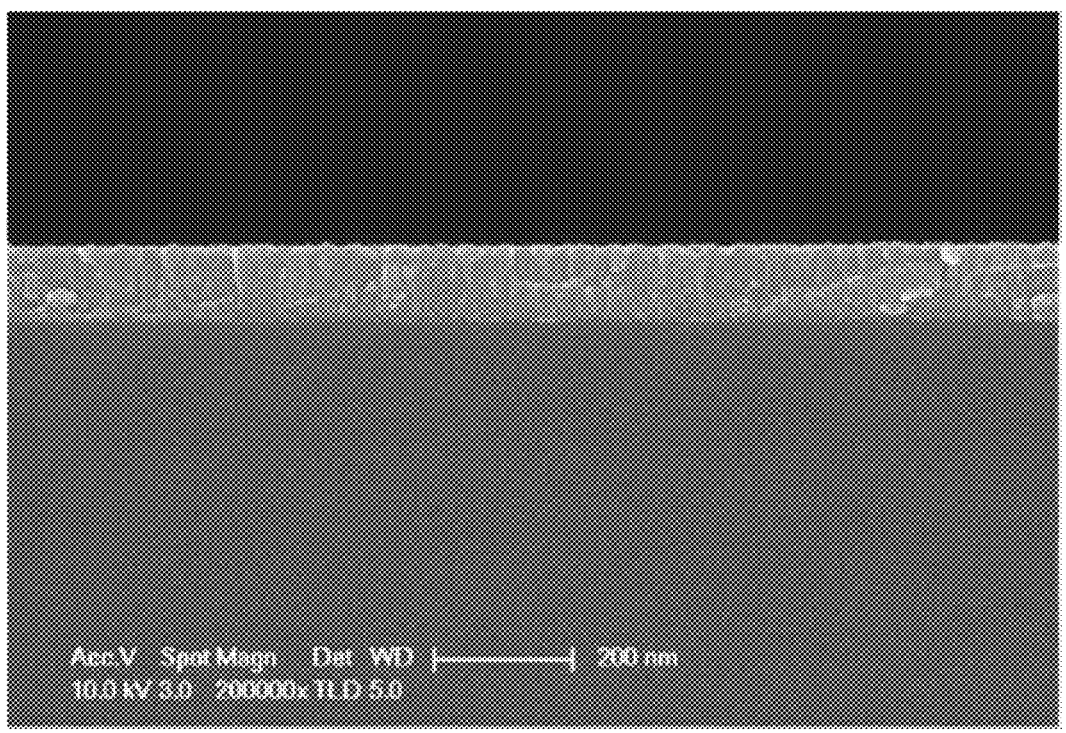
FIG. 7 to FIG. 9 are views showing an enlarged cross-section, a composition analysis and a diffraction pattern of a ZnO-based thin film deposited according to Example 1 of the present invention.
Figure 8:
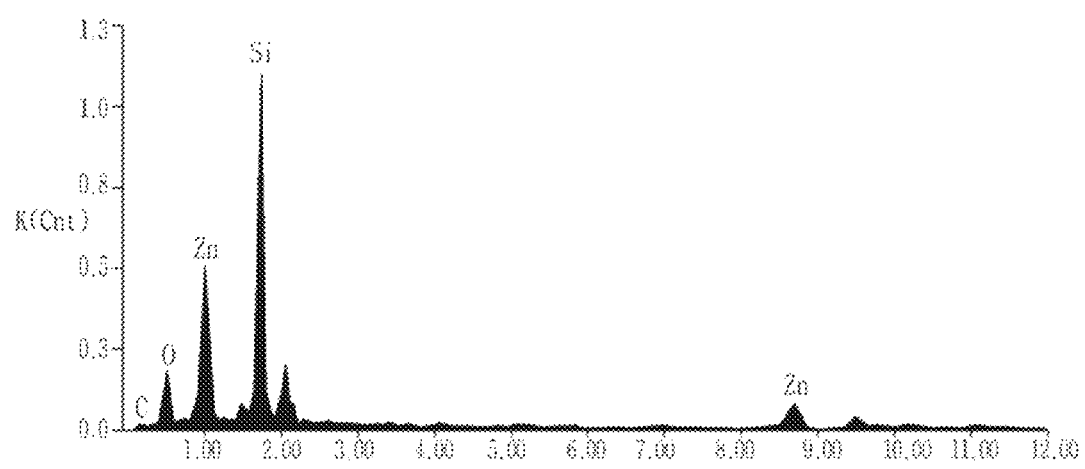
Figure 9:
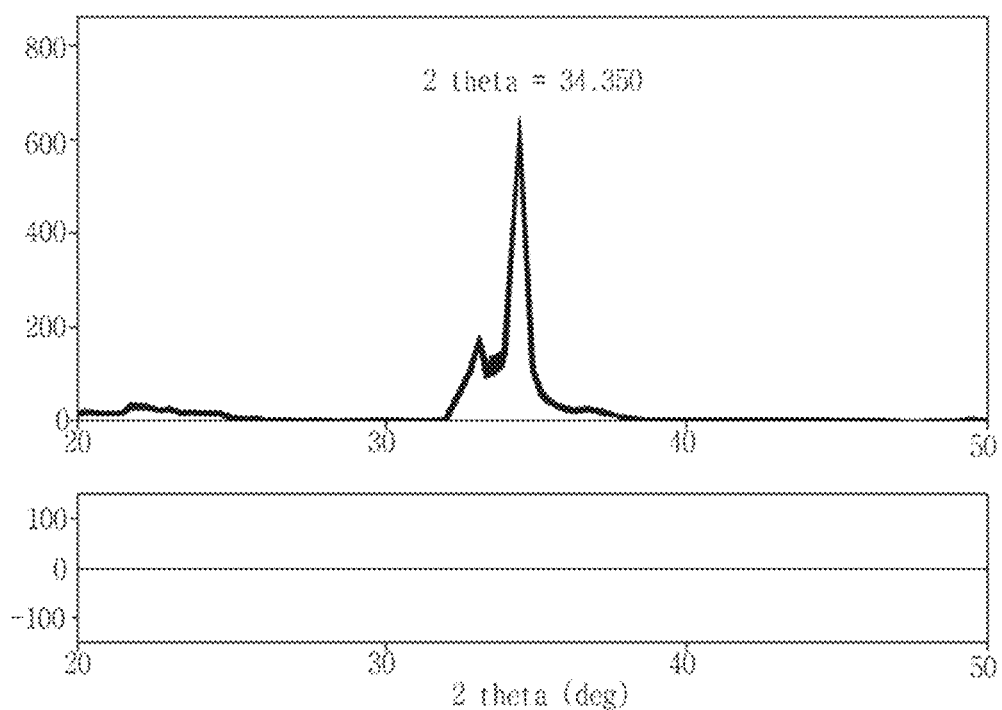

When the ZnO-based thin film produced as such was analyzed by scanning electron microscopy (SEM), crystallinity which grew in the direction of the c-axis of a columnar structure having a thin-film thickness of 90 nm was observed (see FIG. 7 and FIG. 8). In addition, as the result of X-ray diffraction analysis, a (002) crystal face in the c-axis direction in vicinity of $2\theta=34.4$ (degrees) was observed (see FIG. 9). Furthermore, when an analysis was performed using a sheet resistance tester, a resistance of $2.222*10^3$ Ω/▽ (a specific resistance of $2*10^{-3}$ Ωcm) was obtained. In addition, when an infrared (IR) spectrometry analysis was performed, a transmittance of 80% or greater in the visible light range was obtained.

As a result, when the ZnO-based thin film was deposited according to Example 1 of the present invention, it was possible to produce the transparent conductive ZnO-based thin film that has the (002) crystal face in the c-axis direction which is excellent in terms of carrier mobility. The transparent conductive ZnO-based thin film also had a high light transmittance and a low resistance.

Example 2

1. Preparation of Source Material (ZnO Precursor)

A source material was prepared according to Example 1 above.

2. Deposition of ZnO-Based Thin Film

A glass substrate was set to a heating part that is disposed in a deposition chamber of a CVD apparatus, the degree of vacuum inside the deposition chamber was set to atmospheric pressure, the temperature inside the canister was set to 40° C., and the temperature of the glass substrate was maintained at 350° C. In sequence, a ZnO-based thin film was deposited on the glass substrate for 20 minutes by supplying a carrier gas at a flow rate of 500 sccm/min to the source material using a gas flow rate controller in order to help the source material become vaporized, supplying Ar gas to the source material at a flow rate of 200 sccm/min through a carrier gas supply line which was heated to 80° C., and supplying Oxygen gas to the source material at a flow rate of 300 sccm/min.

Figure 10:
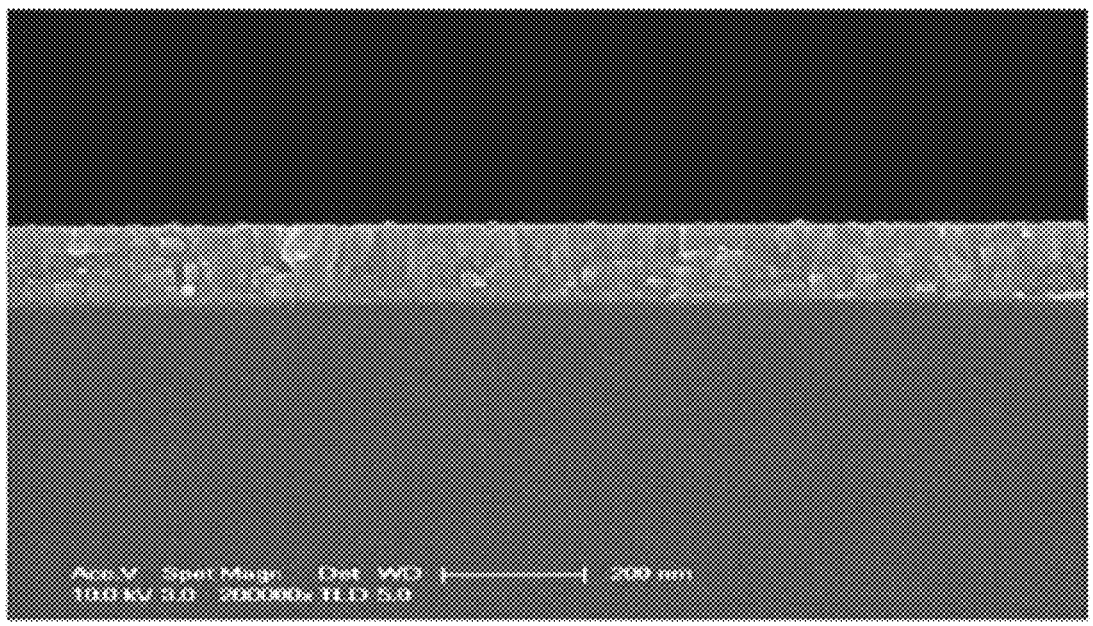
FIG. 10 to FIG. 12 are views showing an enlarged cross-section, a composition analysis and a diffraction pattern of a ZnO-based thin film deposited according to Example 2 of the present invention.
Figure 11:
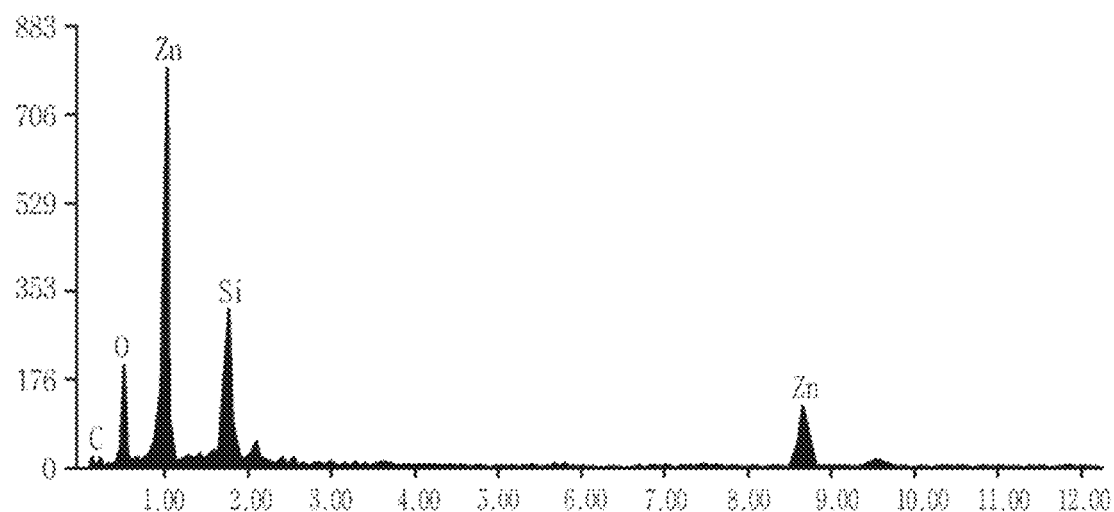
Figure 12:
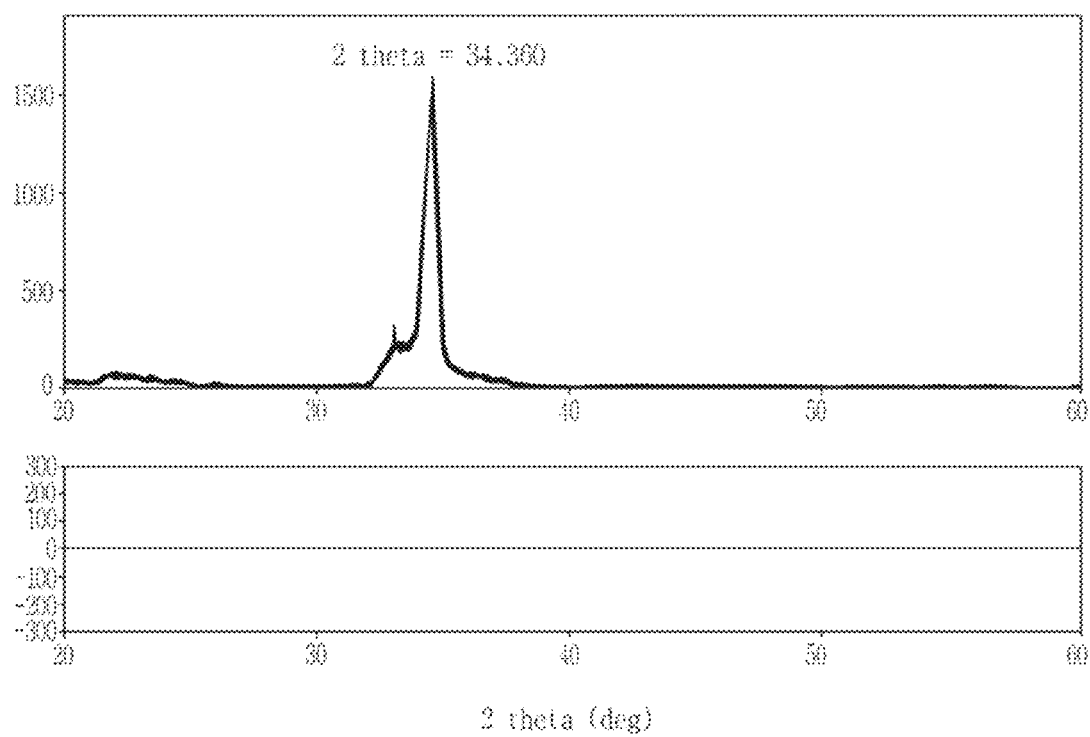

When the ZnO-based thin film produced as such was analyzed by SEM, crystallinity which grew in the direction of the c-axis of a columnar structure having a thin-film thickness of 140 nm appeared (see FIG. 10 and FIG. 11). In addition, as the result of X-ray diffraction analysis, a (002) crystal face in the c-axis direction appeared in vicinity of $2\theta=34.4$ (degrees) (see FIG. 12). Furthermore, when an analysis was performed using a sheet resistance tester, a resistance of $4.28*10^3$ $\Omega/\square$ (a specific resistance of $6*10^{-3}$ $\Omega$cm) was obtained. In addition, when an IR spectrometry analysis was performed, a transmittance of 80% or greater in the visible light range was obtained.

As a result, when the ZnO-based thin film was deposited according to Example 2 of the present invention, it was possible to produce the transparent conductive ZnO-based thin film that has the (002) crystal face in the c-axis direction which is excellent in terms of carrier mobility. The transparent conductive ZnO-based thin film also had a high light transmittance and a low resistance.

The foregoing descriptions of specific exemplary embodiments of the present invention have been presented with respect to the drawings. They are not intended to be exhaustive or to limit the present invention to the precise forms disclosed, and obviously many modifications and variations are possible for a person having ordinary skill in the art in light of the above teachings.

It is intended therefore that the scope of the present invention not be limited to the foregoing embodiments, but be defined by the Claims appended hereto and their equivalents.

What is claimed is:

1. A method of depositing a zinc oxide-based thin film on a substrate by chemical vapor deposition, comprising depositing the zinc oxide-based thin film using a zinc oxide precursor and an oxidizer, the zinc oxide precursor comprising:
   a mixture solvent comprising at least two organic solvents which are mixed; and
   a zinc oxide precursor source material which is diluted in the mixture solvent,
   wherein a ratio of the at least two organic solvents is set to be such that a vapor pressure of the mixture solvent is substantially identical to a vapor pressure of the zinc oxide precursor source material.

2. The method of claim 1, wherein the organic solvents comprise paraffin-based hydrocarbon expressed by a formula $C_nH_{2n+2}$ or cyclo-paraffin-based hydrocarbon expressed by a formula $C_nH_{2n}$, where n is a number in a range from 5 to 12.

3. The method of claim 2, wherein the organic solvents comprise octane and one of heptane, hexane and pentane.

4. The method of claim 1, wherein the chemical vapor deposition comprises controlling the vapor pressure of the zinc oxide precursor source material to be in a range from 95 to 99% of the vapor pressure of the mixture solvent.

5. The method of claim 1, wherein the chemical vapor deposition comprises atmospheric pressure chemical vapor deposition.

6. The method of claim 1, wherein the chemical vapor deposition comprises vaporizing the zinc oxide precursor, and supplying a vaporized gas of the zinc oxide precursor into a deposition chamber in which the substrate is placed.

7. The method of claim 6, vaporizing the zinc oxide precursor comprises blowing a gas into the zinc oxide precursor.

8. The method of claim 6, wherein the zinc oxide precursor is carried by a carrier gas into the deposition chamber, the carrier gas comprising an inert gas.

9. The method of claim 1, wherein the oxidizer comprises at least one selected from the group consisting of oxygen gas, ozone gas, nitrogen oxide gas, water vapor and alcohol vapor.

10. The method of claim 1, wherein the chemical vapor deposition comprises doping the zinc oxide-based thin film with a dopant.

11. The method of claim 1, wherein the substrate comprises one selected from the group consisting of a Si substrate, a sapphire substrate, a ceramic substrate, a glass substrate, a metal oxide substrate and a metal substrate.

12. The method of claim 1, wherein the zinc oxide precursor source material comprises diethyl zinc or dimethyl zinc.

13. The method of claim 1, wherein a content of the zinc oxide precursor source material ranges from 0.1 to 2 mol/L.

* * * * *